(12) United States Patent
Lin

(10) Patent No.: US 10,725,239 B2
(45) Date of Patent: Jul. 28, 2020

(54) MID-INFRARED INTEGRATED PHOTONICS FOR CHEMICAL SENSING

(71) Applicant: The Texas A&M University System, College Station, TX (US)

(72) Inventor: Pao Tai Lin, College Station, TX (US)

(73) Assignee: The Texas A&M University System, College Station, TX (US)

( * ) Notice: Subject to any disclaimer, the term of this patent is extended or adjusted under 35 U.S.C. 154(b) by 0 days.

(21) Appl. No.: 16/179,470

(22) Filed: Nov. 2, 2018

(65) Prior Publication Data

US 2019/0129094 A1   May 2, 2019

Related U.S. Application Data

(60) Provisional application No. 62/580,681, filed on Nov. 2, 2017.

(51) Int. Cl.
*G02B 6/10* (2006.01)
*G01N 21/77* (2006.01)
*C30B 25/18* (2006.01)
*G01N 21/35* (2014.01)

(52) U.S. Cl.
CPC .............. *G02B 6/102* (2013.01); *C30B 25/18* (2013.01); *G01N 21/7703* (2013.01); *G01N 21/35* (2013.01); *G01N 2201/0846* (2013.01)

(58) Field of Classification Search
CPC .................. G01N 21/552; G01N 21/7703
See application file for complete search history.

(56) References Cited

U.S. PATENT DOCUMENTS

| 7,559,594 B2 * | 7/2009 | McMillen .............. B60N 2/206 296/65.09 |
| 7,724,997 B2 | 5/2010 | Kittaka et al. |
| 9,709,504 B2 | 7/2017 | Osterlund et al. |
| 2006/0228064 A1 * | 10/2006 | Hunt ..................... G02F 1/0316 385/2 |
| 2009/0041405 A1 | 2/2009 | Dai et al. |
| 2011/0090484 A1 * | 4/2011 | Osterlund ............ G01N 21/552 356/51 |
| 2013/0142477 A1 | 6/2013 | Diemeer |
| 2014/0185042 A1 * | 7/2014 | Baets ................... G01N 21/658 356/301 |

(Continued)

OTHER PUBLICATIONS

"U.S. Appl. No. 16/179,502, Examiner Interview Summary dated Nov. 14, 2019", 3 pgs.

(Continued)

*Primary Examiner* — Yara B Green
(74) *Attorney, Agent, or Firm* — Schwegman Lundberg & Woessner, P.A.

(57) ABSTRACT

A waveguide structure including a mid-infrared-transparent waveguide on a mid-infrared-transparent undercladding may serve as a photonic chemical sensor for measuring characteristic absorptions of analytes brought in physical contact with the waveguide. In some embodiments, a sensor including an amorphous-silicon waveguide on a barium-titanate undercladding can operate at wavelengths ranging from 2.5 μm to about 7 μm; this sensor may be manufactured by epitaxial growth of the undercladding on a substrate, followed by CMOS-compatible creation of the waveguide. Additional embodiments are disclosed.

20 Claims, 7 Drawing Sheets

(56) References Cited

U.S. PATENT DOCUMENTS

| | | | |
|---|---|---|---|
| 2016/0139335 A1* | 5/2016 | Abel | G02F 1/035 385/14 |
| 2017/0055906 A1 | 3/2017 | Bremer | |
| 2017/0082544 A1* | 3/2017 | Van Dorpe | G01N 21/6428 |
| 2017/0285264 A1* | 10/2017 | Cote | B29C 65/02 |
| 2019/0128798 A1 | 5/2019 | Lin | |

OTHER PUBLICATIONS

"U.S. Appl. No. 16/179,502, Non Final Office Action dated Aug. 7, 2019", 11 pgs.

"U.S. Appl. No. 16/179,502, Notice of Allowance dated Nov. 27, 2019", 8 pgs.

"U.S. Appl. No. 16/179,502, Response filed Nov. 6, 2019 to Non-Final Office Action dated Aug. 7, 2019", 9 pgs.

Chen, Li, et al., "12.5 pm/V hybrid silicon and lithium niobate optical microring resonator with integrated electrodes", Optics Express 27003, vol. 21, No. 22, (Nov. 2013), 8 pgs.

Jin, Tiening, et al., "Flexible Mid-infrared Aluminium Nitride Waveguides for Real-time and Label-Free Chemical Sensing", SeTu1E.3. Advanced Photonics Congress (IPR, Networks, NOMA, PS, Sensors, SPPCom) OSA, (2017).

Jin, Tiening, et al., "Monolithic Mid-Infrared Integrated Photonics Using Silicon-on-Epitaxial Barium Titanate Thin Films", ACS Appl. Mater. Interfaces, (2017), 21848-21855.

Jin, Tiening, et al., "Monolithically Integrated Si-on-AlN Mid-Infrared Photonic Chips for Real-Time and Label-Free Chemical Sensing", ACS Appl. Mater. Interfaces, vol. 9, (2017), 42905-42911.

Jin, Tiening, et al., "Real-Time and Label-Free Chemical Sensor-on-a-chip using Monolithic Si-on-BaTiO3 Mid-Infrared waveguides", Scientific Reports 7, (2017), 8 pgs.

Lin, Pao, et al., "Label-Free Glucose Sensing Using Chip-Scale Mid-Infrared Integrated Photonics", Adv. Optical Mater, (2016), 1755-1759.

Lin, Pao, "Real-time and label-free chemical sensing using flexible mid-infrared photonic circuits (Conference Presentation)", Proc. SPIE 10662, Smart Biomedical and Physiological Sensor Technology XV, 106620N, (May 2018), 5 pgs.

Rabiei, Payam, et al., "Heterogeneous lithium niobate photonics on silicon substrates", Optics Express 25573, vol. 21, No. 21, (2013), 9 pgs.

Weigel, Peter, et al., "Lightwave Circuits in Lithium Niobate through Hybrid Waveguides with Silicon Photonics", Scientific Reports, (2016), 9 pgs.

\* cited by examiner

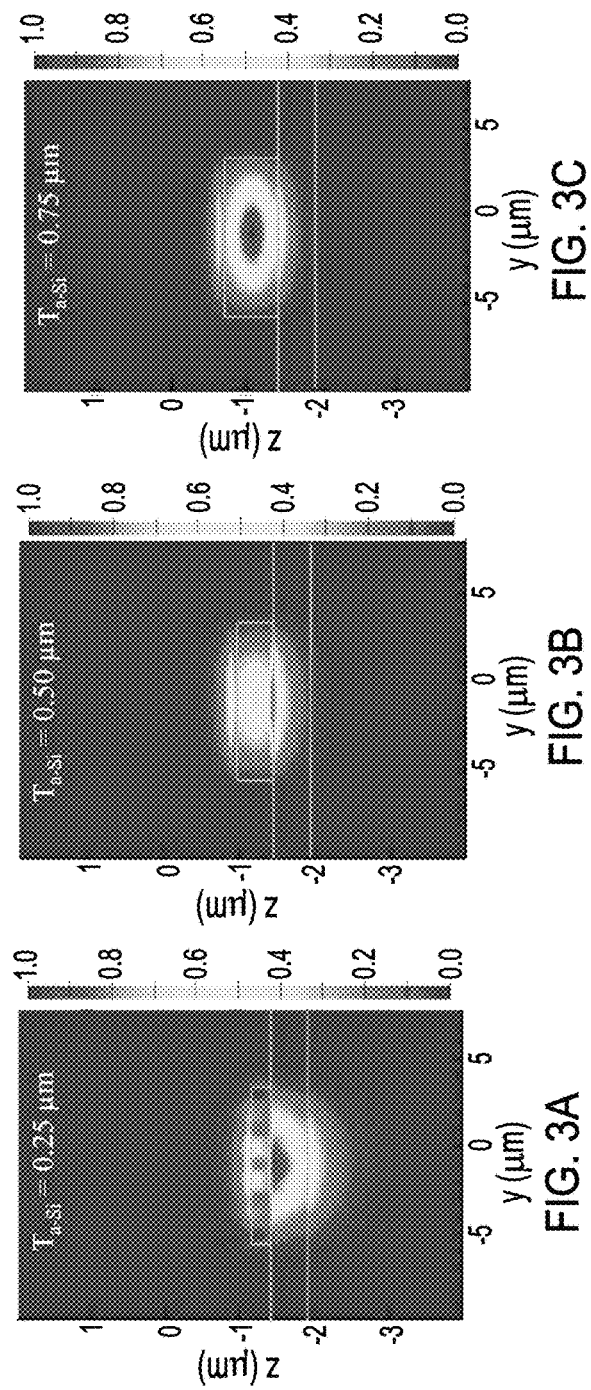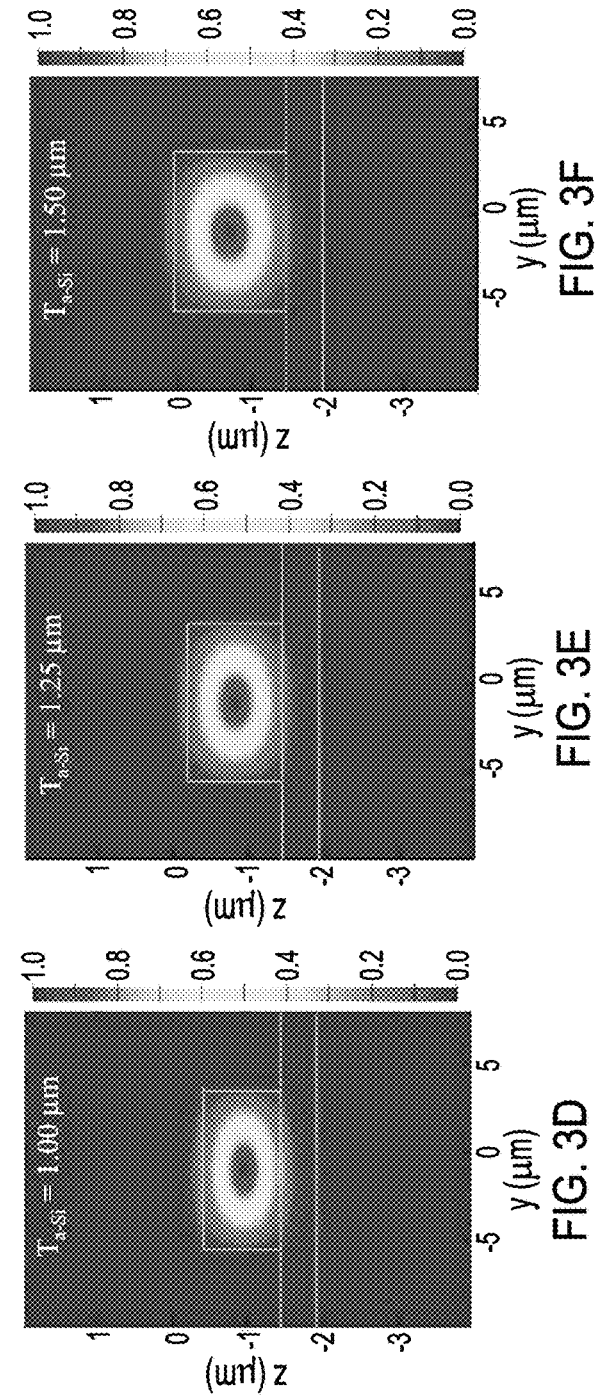
FIG. 3A  FIG. 3B  FIG. 3C
FIG. 3D  FIG. 3E  FIG. 3F

US 10,725,239 B2

MID-INFRARED INTEGRATED PHOTONICS FOR CHEMICAL SENSING

PRIORITY

This application claims the benefit of priority to U.S. Provisional Application Ser. No. 62/580,681, filed Nov. 2, 2017, which is incorporated by reference herein in its entirety.

TECHNICAL FIELD

The present disclosure relates generally to integrated photonics. More specifically, various embodiments relate to photonics-based chemical or biochemical sensors.

BACKGROUND

Infrared (IR) spectroscopy is routinely used for material identification and characterization. Numerous chemical functional groups have characteristic absorption bands and absorption patterns (called "fingerprints") in the IR spectrum that allow determining, or at least narrowing the possibilities for, the types of molecules present in a sample. A common laboratory instrument used for IR spectroscopy is a Fourier transform infrared (FTIR) spectrometer. FTIR spectrometers are benchtop-size apparatus that generally test one sample at a time; are not easily portable; and, as a result, cannot be easily used in the field. In recent years, therefore, efforts have been made to develop chip-scale photonics-based IR spectrometers and biochemical sensors, which provide cost savings and the potential to integrate many sensors into arrays for high-throughput testing. Standard photonic material platforms, such as silicon (Si) or silicon-nitride ($SiN_x$) on silicon oxide ($SiO_2$) or sapphire, however, are limited in their operational wavelength range. While Si and $SiN_x$ are IR-transparent up to about 8 µm, the $SiO_2$ and sapphire undercladdings become opaque at 3.7 and 4.5 µm, which limits or precludes sensing applications at longer IR wavelengths.

BRIEF DESCRIPTION OF THE DRAWINGS

Various aspects and example embodiments are described herein with reference to the accompanying drawings, in which:

FIGS. 3A-3F are optical mode profiles in a waveguide structure in accordance with various embodiments for various waveguide thicknesses;

DESCRIPTION

Figure 1:
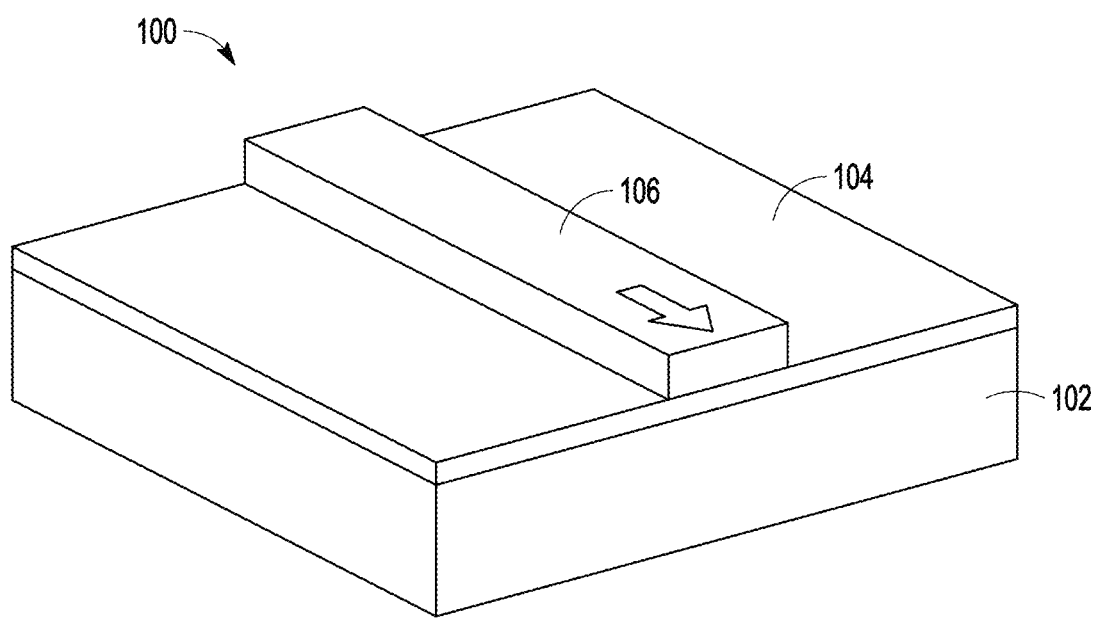
FIG. 1 is a schematic diagram of a waveguide structure in accordance with various embodiments.

Disclosed herein is a new material platform—along with devices, systems, and methods employing same—that extends the operating range of photonic circuits and photonics-based chemical sensors towards longer mid-IR wavelengths.

The term "chemical" is hereinafter used broadly in reference to any organic or inorganic chemical substance, and is intended to encompass, without being limited to, biochemicals, that is, substances occurring within living organisms and/or relating to biological processes. Accordingly, "chemical sensors" and "chemical sensing methods" described herein are also intended to include biochemical sensors and biochemical sensing methods, and, indeed, various embodiments described herein are very suited to biochemical sensing.

In accordance with various embodiments, a waveguide, e.g., made of silicon, is created on an undercladding having a high transparency to mid-IR light at wavelengths up to at least 5 µm, or up to at least 7 µm. For example, barium titanate ($BaTiO_3$, herein also "BTO") and aluminum nitride (AlN) have been found to exhibit high IR transmittance across a wavelength range from 2.5 µm to 7 µm and from 2 µm to 9 µm, respectively and therefore can each be used as a suitable undercladding in mid-IR applications. To use the waveguide as a chemical sensor, the surface of the waveguide is exposed to a sample, and mid-IR light is coupled into the waveguide at one end and detected at the other end. As the light is guided in the waveguide, it remains largely unaffected by the waveguide itself and the undercladding, due to their high mid-IR transparency, but its evanescent field can interact with an analyte (or analytes) within the sample at characteristic absorption wavelengths of the analyte(s), resulting in an absorption spectrum of the detected light that is indicative of the analyte(s). Beneficially, waveguide-based chemical sensors as described herein can be monolithically integrated with the underlying substrate and cladding layers (in the sense that they are amenable to thin-film deposition techniques) and thus also facilitate monolithic integration of the sensors with other optical components of a larger photonic circuit, such as, e.g., on-chip light sources and detectors.

Apart from broad mid-IR transparency, materials and material combinations in accordance with various embodiments described herein also provide other benefits. For example, BTO is a ferroelectric material with high intrinsic electro-optic properties, which renders it suitable for high-speed optical signal processing applications. Extending optical signal processing farther into the mid-IR range can serve to provide additional optical channels and improve data transmission rates. In sensing applications, the electro-optic properties can be utilized, e.g., to perform spectral scanning; electro-optical refractive-index adjustments, for instance, may be used to shift the resonance peak of an optical resonator employed in selecting a certain wavelength for sensing. Furthermore, BTO can be grown epitaxially on a suitable substrate, which provides for relatively low-cost and simple fabrication, compared with more complex fabrication processes such as those involving, e.g., crystal slicing and wafer bonding. AlN, as an alternative undercladding material, offers large optical nonlinearity, which may be used, e.g., for light generation involving the generation of sum or difference frequencies or optical parametric oscillation. In addition, for both BTO and AlN undercladdings, waveguides can be created in a silicon layer on top of the BTO or AlN layer by a standard complementary metal oxide semiconductor (CMOS) process in a simple and cost-effective manner, e.g., using equipment and processes available in existing semiconductor facilities. Other processes can, however, also be used.

In the following, various aspects and example embodiments of the disclosed subject matter are described with reference to the accompanying drawings.

FIG. 1 schematically illustrates a mid-IR-transparent waveguide structure 100 in accordance with various embodiments. The waveguide structure 100 includes a substrate 102, a thin-film undercladding 104 disposed on the substrate 102, and a waveguide 106 formed on top of the undercladding 104. As shown, the waveguide 106 may be a strip (or "ridge") waveguide with a rectangular cross-section, but other cross-sectional shapes and waveguide types (e.g., rib waveguides, slab waveguides, etc.) are also possible.

The waveguide 106 and undercladding 104 are made of materials that are transparent to mid-IR light across a specified, generally application-dependent wavelength range, such that light within that range can propagate along the waveguide substantially unattenuated. A material layer or component is herein deemed "transparent" to light of a given wavelength if it transmits a specified percentage (e.g., at least 80%, or at least 95% in some embodiments,) of the light; the percentage may be set based on the needs of the particular application. For instance, in the context of chemical sensing, any absorption of light by the waveguide and/or undercladding should be negligible to the characteristic absorption of the analyte (i.e., the chemical substance of interest) at analyte concentrations within an expected range. In various embodiments, the waveguide 106 is made of silicon, germanium, or silicon nitride, all of which are transparent (at greater than 95% transmittance) to mid-IR light from about 2.5 µm to about 8 µm. The undercladding 104 is, in some embodiments, made from a ferroelectric oxide, such as BTO or lithium niobate (LN), whose IR-transparent windows extend beyond those of $SiO_2$ and sapphire, with BTO exhibiting high transmittance across the range from about 2.5 mm to about 7 µm and LN exhibiting high transmittance from about 1 µm up to about 5 µm. In some embodiments, the undercladding 104 is made from AlN, which has greater than about 80% transmittance from about 2.5 mm to about 9 µm. The substrate material can be, e.g., lanthanum aluminate (LAO) or silicon, and may be selected based at least in part on the undercladding. A mid-IR-transparent material may be selected for the substrate to avoid absorption of a portion of the evanescent field extending into the substrate.

Figure 2A:
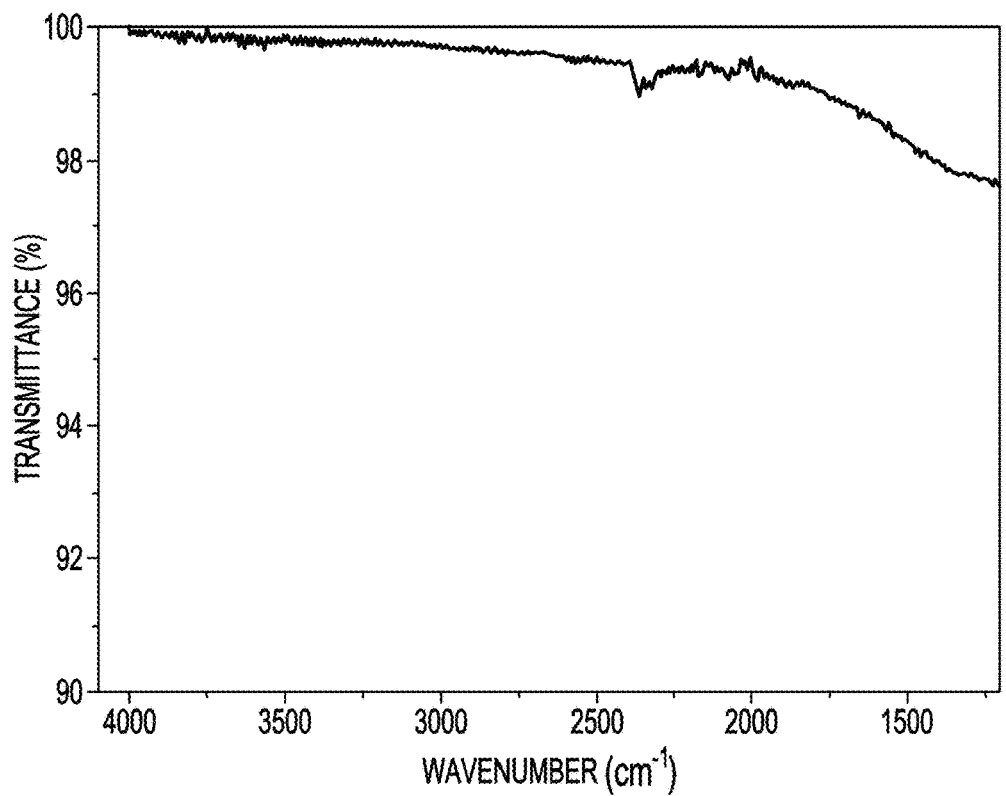
FIG. 2A is a graph of the transmittance of a barium titanate thin film in accordance with various embodiments as a function of wavenumber.

In one embodiment, the waveguide structure 100 is implemented using an amorphous-silicon (a-Si) waveguide 106 on an epitaxial BTO thin-film undercladding 104 grown on an LAO substrate 102. This material combination provides multiple benefits. First, as noted above, BTO thin films have a broad IR-transparent spectrum. This is illustrated in FIG. 2A, which shows the transmittance of an as-deposited BTO thin film as a function of wavenumber (i.e., the inverse of wavelength) as measured by attenuated total reflection FTIR spectroscopy. As can be seen, the transmittance can be above 98% at wavelengths from 2.5 µm (corresponding to a wavenumber of 4000 cm') to 7 µm (corresponding to a wavenumber of 1430 $cm^{-1}$). Since silicon is transparent up to 8 µm, the integrated a-Si-on-BTO platform allows operation at mid-IR wavelengths up to 7 µm. Second, BTO and silicon, with refractive indices of 2.4 and 3.5, respectively, have a high refractive-index contrast, which ensures efficient light confinement in the waveguide, reducing bending losses caused by waveguide curvatures. Third, unlike some other ferroelectrics (such as, e.g., LN), BTO can be grown epitaxially using various thin-film deposition techniques, avoiding the complexity of, e.g., LN thin-film preparation (which may involve crystal slicing, high-temperature annealing, and exfoliation). BTO thin films grown on LAO substrate have been shown to provide good crystallinity and in-plane alignment at thicknesses from about 0.25 µm up to 5 µm; at greater thickness, the films start to become polycrystalline and have a secondary orientation. Fourth, BTO has high chemical stability and mechanical hardness, rendering it suitable for biochemical and toxic sensing under harsh environments. Fifth, the use of amorphous (rather than crystalline) silicon for the waveguide relieves the crystal-lattice-matching constraint between the silicon waveguide and BTO undercladding, allowing an a-Si layer to be directly deposited on the BTO film and then patterned using a standard CMOS process. It has been experimentally shown that this fabrication process can achieve a-Si-on-BTO waveguides with well-defined ridge profiles and sharp facets (without bending or distortion on the edge, or cracks or indents on the waveguide surfaces or BTO film) as well as homogeneous composition of both waveguide and BTO film. These characteristics ensure low optical scattering or other propagation losses of light guided in the waveguide.

Figure 2B:
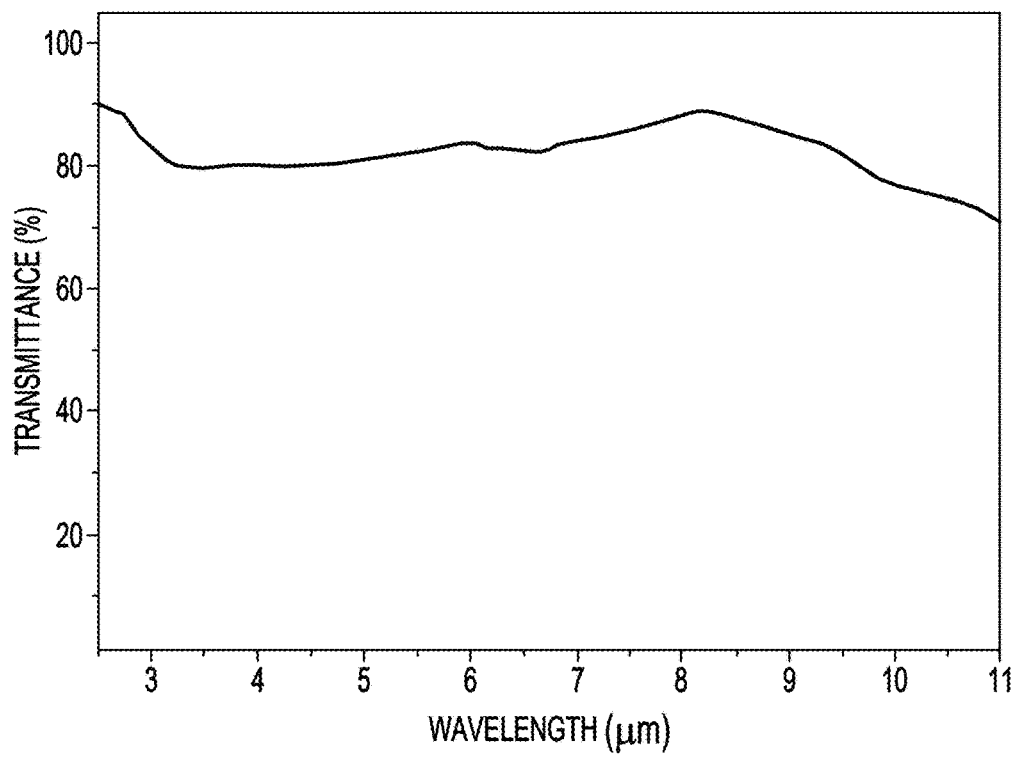
FIG. 2B is a graph of the transmittance of an aluminum nitride thin film in accordance with various embodiments as a function of wavenumber.

In another embodiment, the waveguide structure 100 is implemented using an amorphous-silicon (a-Si) waveguide 106 on an AlN thin-film undercladding 104 grown on a silicon substrate 102. This material combination provides similar benefits as a-Si-on-BTO. As shown in FIG. 2B, the transmittance of an Al—N film is above 80% at wavelengths from 2.5 µm to 9 µm, allowing the a-Si-on-AlN waveguide to operate at mid-IR wavelengths up to 8 µm. Further, with a refractive index varying between about 2 and about 1.5 between 2.5 µm and 9 µm, AlN likewise provides a high refractive-index contrast to silicon, and consequently good optical-mode confinement in the waveguide. Like BTO, AlN is also suitable for sensor applications under harsh environmental conditions due to its mechanical strength, thermal stability, and chemical resistance. From a fabrication standpoint, AlN is beneficial in that it can be sputtered onto the substrate at room temperature.

The distribution of light intensity across the multiple layers of the waveguide structure 100 can be manipulated by adjusting the dimensions of the waveguide 106 and undercladding 104. This is illustrated in FIGS. 3A-3F with optical mode profiles calculated for 3-µm IR light with transverse-magnetic (TM) polarization, guided in a-Si-on-BTO ridge waveguides with a BTO layer thickness of 0.5 µm and a-Si waveguide thicknesses ranging from 0.25 µm to 1.5 µm. As can be seen, with an a-Si waveguide thickness of 0.75 µm (shown in FIG. 3C), the optical mode is approximately centered within the a-Si ridge, with evanescent fields extending into the BTO layer as well as the external medium above the waveguide. As the a-Si waveguide thickness increases (FIGS. 3D-3F), the mode becomes more and more confined in the a-Si ridge. On the other side, a-Si waveguide thicknesses below 0.75 µm (FIGS. 3A and 3B) cause the mode to shift into the BTO layer. At an a-Si thickness of 0.25 µm, most of the optical field resides within the BTO layer. For different material combinations, a similar shift of the mode, with increasing waveguide thickness, from the undercladding to the waveguide on top, followed by increasing confinement within the waveguide, can occur. This relationship between the thickness of the (e.g., a-Si) waveguide and the intensity distribution across the layered waveguide structure can be exploited, in accordance with various embodiments, to tailor the optical mode to the intended application. For chemical sensing applications, which rely on interactions of the optical field with the external medium above the waveguide, it may be desirable to use waveguide thicknesses that result in high-intensity evanescent fields above the waveguide (e.g., sufficiently thick to avoid location of a substantial fraction of the mode in the undercladding, but not so thick as to confine almost all the light in the waveguide). For optical-communications applications that use electro-optic modulation or otherwise take advantage of optical nonlinearity, the top waveguide can be made sufficiently thin to position a substantial portion of the optical field with the ferroelectric undercladding.

Figure 4A:
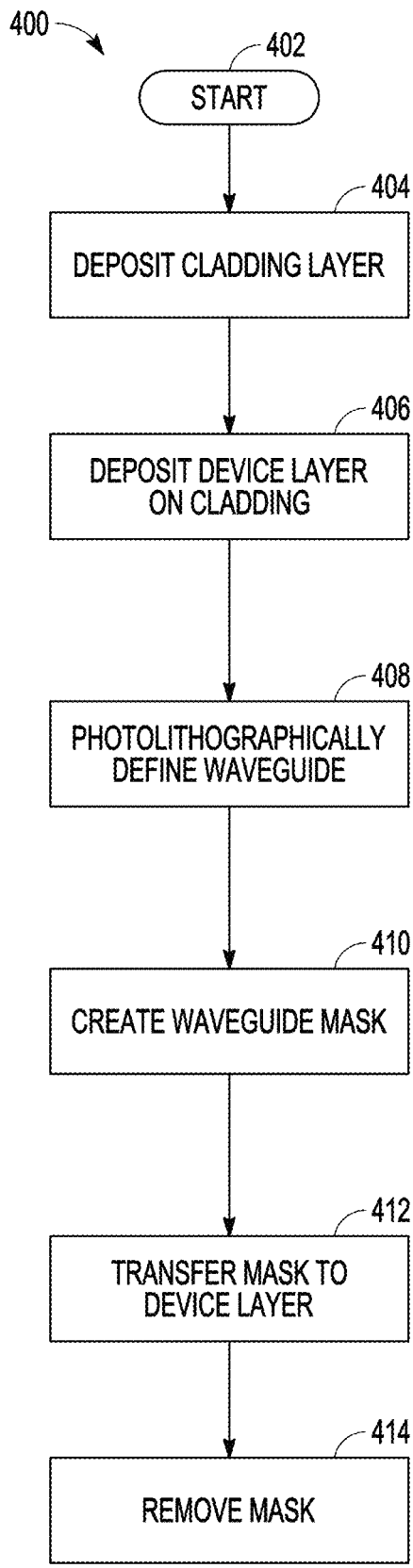
FIG. 4A is a flow chart illustrating a method of fabricating the device structure of FIG. 1 in accordance with various embodiments.
Figure 4B:
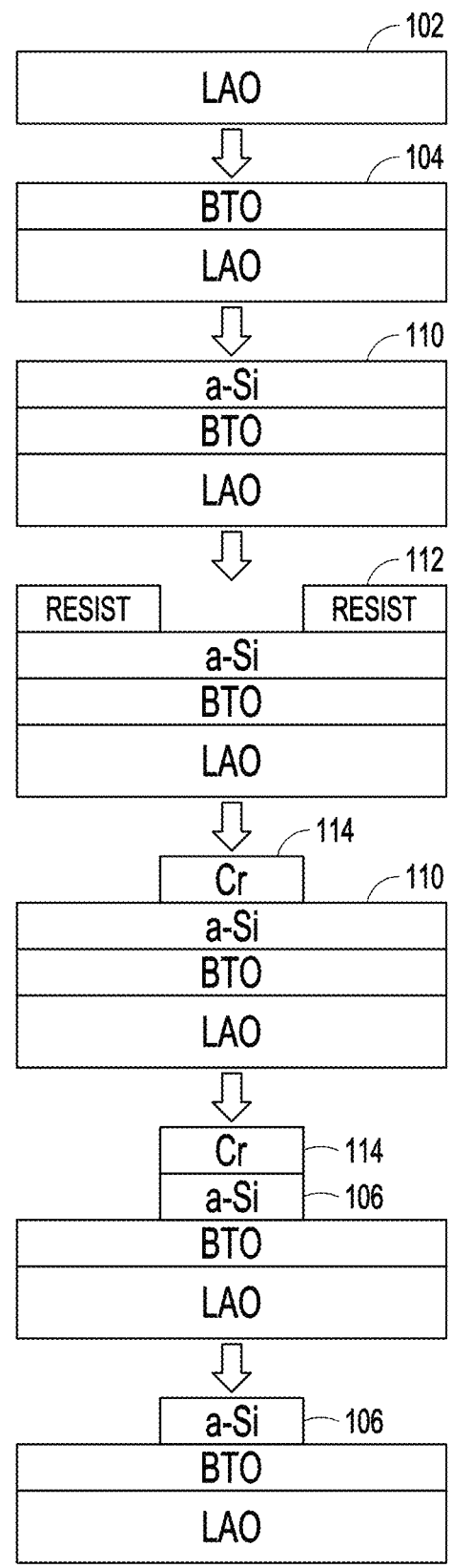
FIG. 4B is a sequence of diagrams illustrating the structures resulting from the various steps shown in FIG. 4A.

FIGS. 4A and 4B illustrate a method 400 of fabricating the waveguide structure 100 in accordance with various embodiments, showing a flow chart of the process steps (FIG. 4A) side by side with the respective structure resulting at the end of each step for an example implementation of the waveguide structure 100 with a-Si-on-BTO on an LAO substrate (FIG. 4B). Starting, at 402, from a substrate 102, the method 400 involves depositing, in step 404, a thin cladding layer on the substrate 102, e.g., by pulsed laser deposition, molecular-beam epitaxy, chemical vapor deposition, sputtering, or some other thin-film deposition technique known to those of ordinary skill in the art. For example, in the embodiment illustrated in FIG. 4B, a thin epitaxial film 104 of BTO is grown on a single-crystal LAO substrate 102. In one specific implementing process, the BTO film 104 is deposited by pulsed laser deposition at 10 Hz, using a KrF excimer laser and maintaining the substrate at a temperature of 700° C. and the $O_2$ partial pressure at 40 mTorr, and following deposition, the film is annealed at 600° C. in 200 Torr $O_2$ for an hour and then cooled to room temperature. In an a-Si-on-AlN embodiment, a thin AlN film may be deposited on a silicon (or other) substrate, e.g., by room-temperature direct current (DC) sputtering.

In step 406, a device layer in which the waveguide will be formed, such as a thin (e.g., 1 µm thick) a-Si film 110, is deposited on the cladding (which, thus, will function as an undercladding to the waveguide). In one embodiment, the a-Si film 110 is grown on the BTO layer 104 (or, alternatively, an AlN layer) by plasma-enhanced chemical vapor deposition, e.g., using a $SiH_4$ precursor gas and a deposition temperature of 200° C. The use of amorphous silicon allows for the formation of a smooth interface between the cladding layer (e.g., a crystalline BTO layer 104) and the silicon device layer 110.

Next, in step 408, the waveguide is defined photolithographically in a patterned photoresist layer 112, which is then used, in step 410, to create a mask 114, e.g., made of chromium and 50 nm in thickness, by electron beam evaporation followed by lift-off of the photoresist layer along with the chromium layer deposited thereon. In step 412, the mask defining the structure of the waveguide is transferred to the device layer (e.g., a-Si layer 112), for instance, by reactive ion etching. Among various possible etchants for this purpose (which include, e.g., $SF_6$, HF, $XeF_2$, $BCl_3$, $Cl_2$, $CF_4$, $CHF_3$, Ar, or combination thereof), a particularly suitable choice is sulfur hexafluoride ($SF_6$). $SF_6$ (unlike, e.g., hydrofluoric acid (HF)) does not react with the BTO film and has a high etching ratio between Si and AlN. Accordingly, etching with $SF_6$ avoids surface roughness of the BTO layer and a-Si waveguide facets that may otherwise result from ion damage. Sharp a-Si waveguide facets and smooth cladding surfaces and cladding-waveguide interfaces are important to minimize propagation and scattering losses. In step 412, the waveguide structure 100 is finalized by removing the (chromium) mask 114 and any organic residue on the device surface. In one embodiment, this removal is achieved with ceric ammonium nitrate solution, followed by an oxygen plasma ashing process.

Figure 5A:
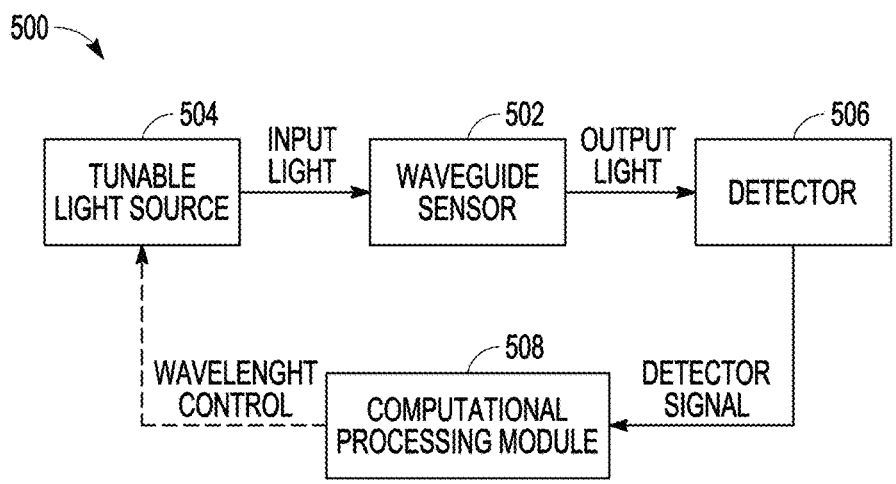
FIGS. 5A and 5B are block diagrams form of chemical sensing systems incorporating the waveguide structure of FIG. 1 in accordance with various embodiments.
Figure 5B:
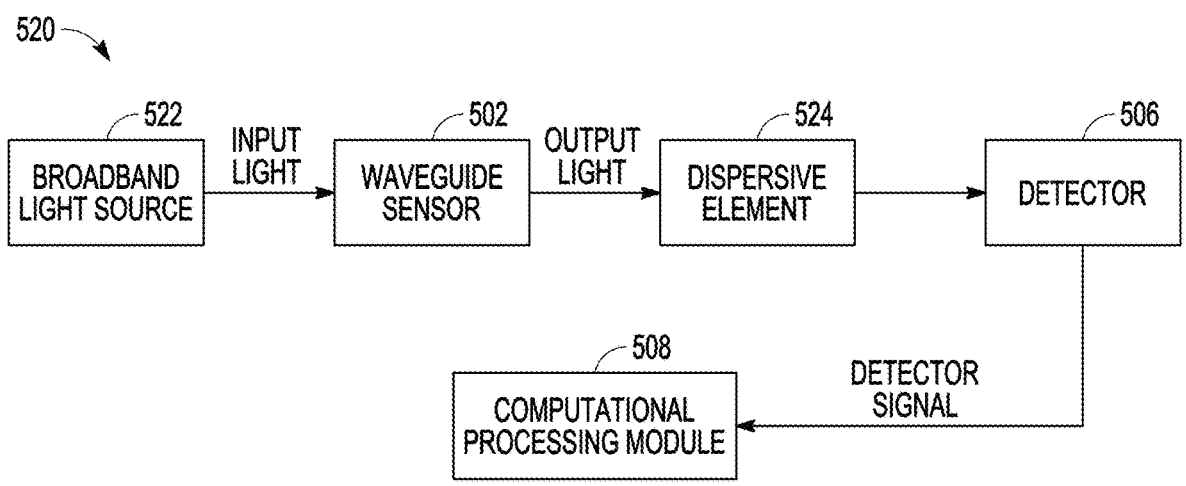

Mid-IR-transparent waveguide structures 100 as described herein can be used as chemical sensors. FIGS. 5A and 5B provide, in block-diagram form, conceptual depictions of example chemical sensing systems in accordance with various embodiments that each incorporate such a waveguide sensor (as implemented by a waveguide structure 100). Shown in FIG. 5A is a system 500 that includes, in addition to the waveguide sensor 502, a tunable mid-IR light source 504 (e.g., a tunable laser) coupling light, directly or indirectly, into the waveguide sensor 502, a mid-IR detector 506 measuring the light exiting the waveguide sensor 502, and a computational processing module 508 that processes the measured signal. The computational processing module 508 may be implemented in analog or digital circuitry; if the latter, the electronic output of the detector 506 may be converted into a digital signal by an analog-to-digital converter (not shown). In some embodiments, the computational processing module 508 is provided by a programmable processor (e.g., a field-programmable gate array (FPGA) or general-purpose central processing unit (CPU)) executing suitable software.

The light source 504 is tunable over an operating wavelength range of the sensing system 500, facilitating measurements of absorption spectra, across that wavelength range, of samples in contact with the waveguide sensor 502 and detection of analytes with characteristic absorptions at wavelengths within that range. In some embodiments, the operating wavelength range extends from about 2.5 µm or less to about 7 µm or more. The detector 506 may be, for instance, a photodetector that measures the overall intensity of the light output by the waveguide sensor 502, or, alternatively, a camera (e.g., an array of photosensors) that allows imaging the optical mode at the waveguide sensor output. Either way, the detector 506 is selected or configured to be sensitive to light within the operating wavelength range. In various embodiments, for instance, an indium antimonide (InSb) infrared camera, which is responsive to light from less than 1 µm up to 5.3 µm, or an HgCdTe (MCT) camera, which is sensitive up to at least 7 µm, is used. The computational processing module 508 may be configured to create a spectrum by associating the measured output signal of the sensor 502 at a given time with the respective wavelength input by the light source at that time. The computational processing module 508 may have knowledge of the light-source wavelength by virtue of controlling the tunable wavelength itself, or by receiving a signal indicative of the wavelength from a separate light-source controller (not shown). In addition to computing a spectrum, the computational processing module 508 may also implement processing logic for analyzing the spectrum, e.g., based on data about the absorption characteristics of a various chemical substances (e.g., as stored in memory of the computational processing module 508), to identify analytes present within the sample and/or determine their concentration.

Alternatively to acquiring a spectrum by varying the wavelength with time, the system 500 can also be operated continuously at a given wavelength, e.g., corresponding to the characteristic absorption of a certain analyte, to measure a time-resolved absorption signal indicative of a (possibly variable) concentration of the analyte in the sample.

FIG. 5B shows an alternative sensing system 520 including, instead of a tunable light source, a light source 522 providing broadband light covering the operating wavelength range. To facilitate the acquisition of a spectrum, the system 500 may further include a dispersive element 524 at the output of the waveguide sensor 502, preceding the detector(s) 506, to spatially spread out the light by wavelength. Using a camera as the detector 506; the output intensity at different wavelengths can then be measured at different respective locations within the sensor array of the camera. Alternatively to a camera, multiple photodetectors (e.g., a photodiode array detector) may be placed at different locations corresponding to different respective wavelengths, or a single detector (or camera) may be moved to measure the intensity for different wavelengths. In a broadband-light sensing system 520, the computational processing module 508 generates a spectrum by associating the location of the measured light intensity with wavelength.

In both sensing systems 500, 520, the light emitted by the light source 504, 522 may be collimated, e.g., with a refractive lens, into an optical fiber, which may then be butt-coupled to the waveguide sensor 502. Similarly, the light output by the waveguide sensor 502 may be focused by a lens (e.g., a barium fluoride biconvex lens) onto the camera or other detector 506. Alternatively, the light source 504, 522 and/or detector 506 may be implemented as photonic-circuit components and monolithically integrated with the sensor 502 on the same substrate. Lasers and detectors may be formed, e.g., by silicon device structures (which may be created in the a-Si layer 110 by the same or similar methods as used for the creation of the waveguide 102 that serves as the sensor) in conjunction III-V structures serving as active regions and associated electrodes, which may likewise be patterned using standard CMOS processes. Suitable photonic-component structures and manners of manufacturing same are well-known to those of ordinary skill in the art. To provide just one example, in some embodiments, a quantum cascade laser, which can emit light in the mid-IR regime, may be used as the light source. If integrated as photonic-circuit components, the light source 504, 522 and sensor 506 may directly couple to a waveguide a portion of which serves as the waveguide sensor 502.

Figure 6:
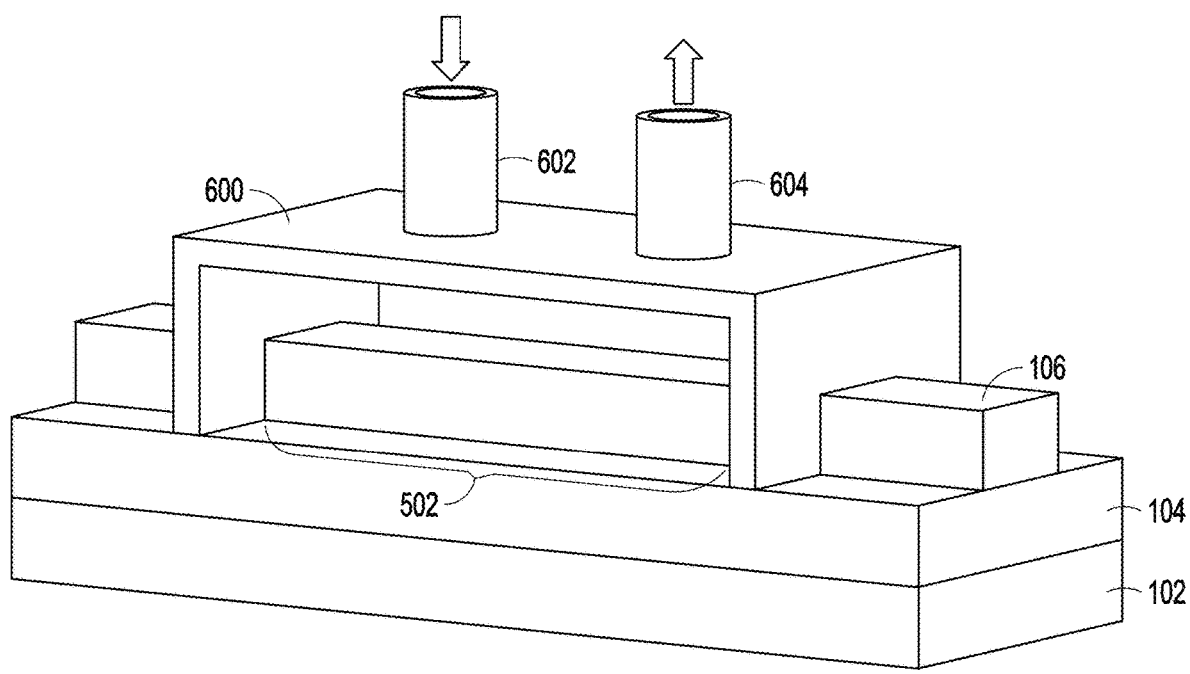
FIG. 6 is a cut-away perspective view of a waveguide sensor enclosed in a microfluid chamber in accordance with various embodiments.

To measure the mid-IR absorptions of a chemical sample, the sample, which may be a liquid, gas, or solid (e.g., powder), can be brought in contact with the waveguide sensor 502 by various means. For example, a liquid sample may be dispensed onto the waveguide using a pipette, syringe, or similar tool, e.g., to form a drop on top of the waveguide or surrounding a portion of the top and side facets of the waveguide ridge. Alternatively, as shown in a cut-away perspective view in FIG. 6, a portion of the waveguide may be enclosed in a microfluidic chamber 600 having a fluid inlet 602 and fluid outlet 604, and the sample may be pumped into and fill that chamber 600. The chamber 600 may be formed from any suitable material, e.g., of a polymeric organosilicon such as polydimethylsiloxane (PDMS). Methods for fabricating such opto-fluidic chips are known to those of ordinary skill in the art.

In various embodiments, multiple waveguide sensors 502 are created on a single chip, e.g., in an array, and optionally each provided with a microfluidic chamber 600 holding the sample, to enable simultaneous measurements of multiple samples for high-throughput applications. The waveguide sensors 502 may receive input light from separate respective (e.g., on-chip) light sources 504, or from a single light source 504 whose output is optically split between multiple channels including the multiple respective sensors 502. Each sensor 502 may have its own respective associated detector 506. It is also possible to switch the output of a light source 504, and similarly the input of a detector 506, cyclically between multiple respective sensors 502 for sequential measurements with the sensors 502; the time in between successive measurements with any given sensor can be used to load a new sample into the associated microfluidic chamber 600, or otherwise bring a new sample into contact with the sensor 502.

Figure 7:
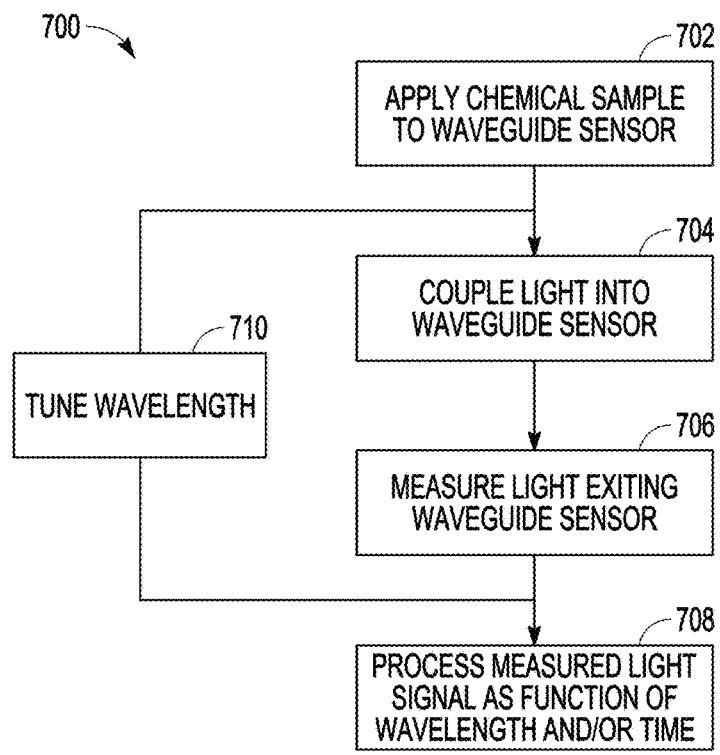
FIG. 7 is a flow chart of a method for chemical sensing in accordance with various embodiments.

With reference now to FIG. 7, a chemical sensing method 700 in accordance with various embodiments is illustrated in the form of a flow chart. The method 700 involves applying a chemical sample to a waveguide sensor 502 as described herein, e.g., by dispensing a sample liquid or powder from above onto the waveguide sensor 502, filling a chamber formed above the waveguide sensor 502 with the sample, and/or flowing a liquid or gas across the surface of the waveguide sensor 502 (e.g., through a chamber formed above the waveguide) (act 702). Once applied to the waveguide sensor 502, the sample can optically interact with the evanescent field extending from the waveguide sensor 502 into the sample, which may result in characteristic absorptions at certain wavelengths. To measure these characteristic absorptions, light is coupled (e.g., from a laser light source) into the waveguide sensor 502 at one end (act 704) and light exiting the waveguide sensor 502 at the other end is measured, e.g., with a camera or photodetector (act 706). In some embodiments, the intensity of the output light is measured with a single photodetector. In other embodiments, the measurement involves capturing an optical mode profile of the output light on camera, and determining an associated mode intensity, which may be, e.g., an aggregate intensity across the profile or a peak intensity (e.g., as aggregated over a small area surrounding the geometric center of the mode profile). The optical mode launched into the waveguide sensor 502 may be a fundamental mode, and may in principle be either transverse electric (TE) or transverse magnetic (TM). In certain embodiments, a TM mode is selectively excited in the waveguide, e.g., by virtue of the waveguide geometry and/or the light source. Beneficially, TM modes have been found to exhibit stronger evanescent fields, resulting in stronger interactions of the light with the surrounding chemical sample and, consequently, larger absorption signals.

The measured light (i.e., the generated detector signal) is processed, in act 708, to detect characteristic absorptions therein. To discriminate between multiple possible analytes, the wavelength of the light coupled into the waveguide sensor 502 may be tuned across at least a portion of the operating range of the sensing system (act 710), allowing the processed detector signal to measure the light intensity at the sensor output as a function of wavelength. Observed decreases in intensity at certain wavelengths or within certain wavelength bands correspond to characteristic absorptions that provide information about the analytes. Certain chemical functional groups, such as O—H, N—H, C—H, or groups with double or triple bonds between C, N, and O, for instance, can be identified, and discriminated between, based on their absorption at certain respective wavelengths. For example, —CH absorbs strongly between 3.0 and 3.2 µm, whereas —OH absorbs between 2.8 and 2.9

μm. Further, at longer mid-IR wavelengths (e.g., at wavelengths greater than 6 μm), absorptions due to stretching and bending vibrations (e.g., of C—C, C—O, or C—N bonds) tend to vary with the larger molecular structure. For certain complex (e.g., biological) molecules with multiple stretching and bending absorptions, the absorptions can collectively provide a molecular "fingerprint" that allows identifying the substance. Examples of substances that have absorptions in the mid-IR wavelength range are hexane (absorptive at 6.9 mm) and nitric oxide (absorptive at 5.3 μm). Processing the measured signal may involve, in some embodiments, comparing detected absorptions against the known characteristic absorptions of various chemicals substances to identify which substances are present in the sample. Alternatively or additionally, given knowledge of a certain analyte in the sample and of its respective absorption wavelength, the concentration of that analyte can be monitored by tuning to the respective wavelength, measuring the output intensity as a function of time, and then computationally converting the intensity to concentration (e.g., based on a preceding calibration).

Figure 8A:
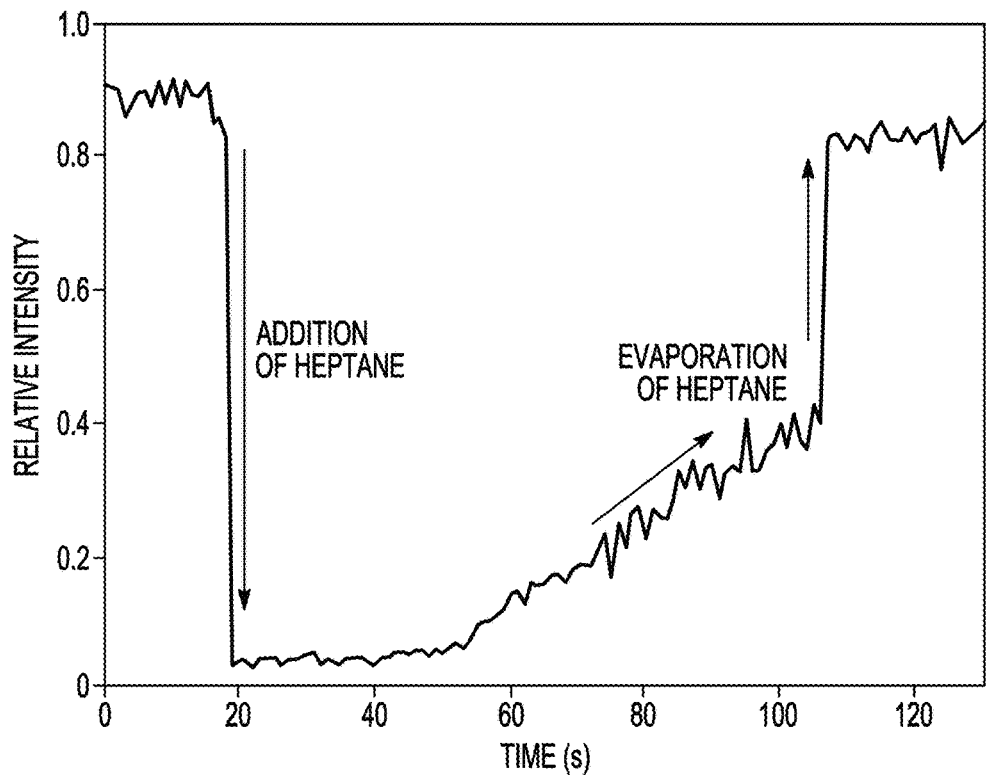
FIGS. 8A and 8B are graphs illustrating the transient response of a waveguide sensor in accordance with various embodiments to heptane and methanol, respectively.
Figure 8B:
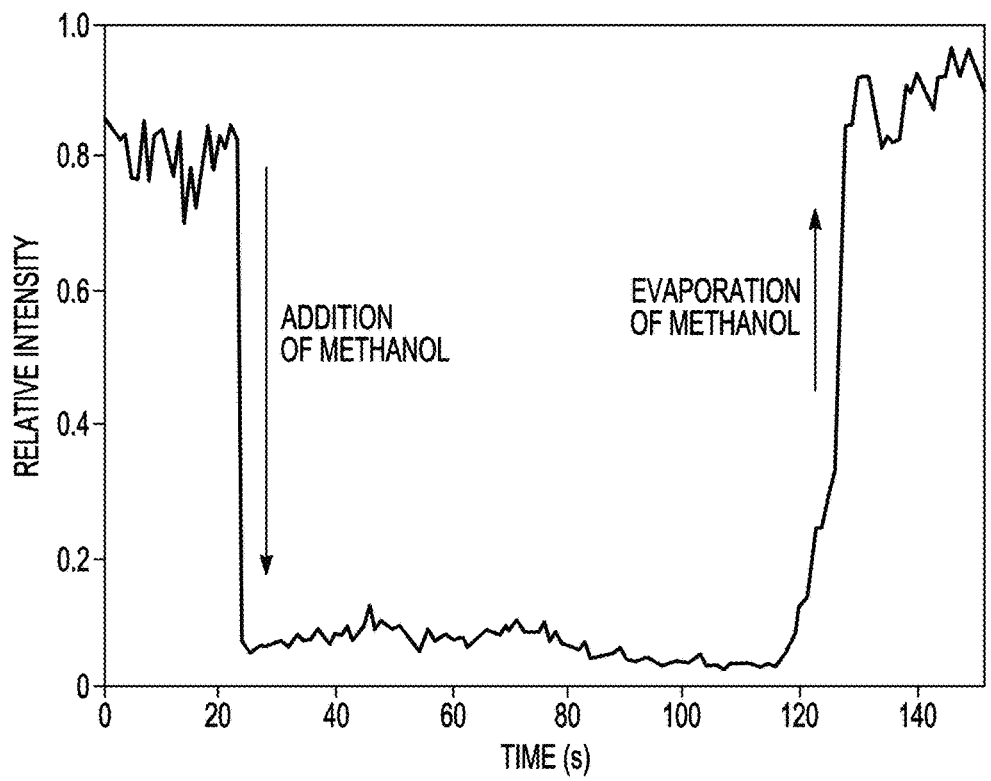

Beneficially, the sensing method 700 allows for the label-free detection of analytes, as well as for real-time, in-situ concentration monitoring. As an illustration of real-time monitoring, FIGS. 8A and 8B show the transient response of an a-Si-on-BTO waveguide sensor, reflected in a time-varying intensity of the measured light at the output, upon exposure to heptane and methanol, respectively. For heptane detection, the wavelength of the light was tuned to 3.1 μm, which is within the —CH absorption band. As shown in FIG. 8A, the measured intensity, which was high prior to addition of the analyte (for the first 20 seconds of the measured signal), decreased significantly as heptane was dropped on the waveguide surface (at t=20 s), remained low until t=50 s, and then started to recover, due to gradual evaporation of the heptane, until it reached its original level at 110 seconds. To track methanol, the wavelength was tuned to 2.9 μm to match the characteristic —OH absorption. As shown in FIG. 8B, the light intensity dropped at t=25 s, coinciding with the addition of methanol to the waveguide, and then recovered at around t=120 s due to evaporation. Very similar transient responses to heptane and methane were obtained with an a-Si-on-AlN waveguide sensor. This data also shows that the waveguide-based chemical sensor described herein is reusable.

Although embodiments have been described with reference to specific example embodiments, it will be evident that various modifications and changes may be made to these embodiments without departing from the broader scope of the invention. Accordingly, the specification and drawings are to be regarded in an illustrative rather than a restrictive sense. The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be used and derived therefrom, such that structural and logical substitutions and changes may be made without departing from the scope of this disclosure. This description, therefore, is not to be taken in a limiting sense, and the scope of various embodiments is defined only by the appended claims, along with the full range of equivalents to which such claims are entitled.

What is claimed is:

1. A mid-infrared chemical sensing system comprising:
   a photonic chemical sensor comprising a waveguide disposed on an undercladding, the undercladding being made substantially of barium titanate or of aluminum nitride, the waveguide and undercladding both being transparent to light over a range of wavelengths from about 2.5 μm to at least about 5 at least a portion of the waveguide being exposable to a chemical sample;
   a light source configured to couple light into the waveguide at a first end thereof; and
   a detector configured to measure light exiting the waveguide at a second end thereof.

2. The chemical sensing system of claim 1, wherein the waveguide and undercladding are both transparent to light up to at least 7 μm.

3. The chemical sensing system of claim 1, wherein the waveguide and undercladding have greater than 95% transmittance to light over the range of wavelengths from about 2.5 μm to at least about 5 μm.

4. The chemical sensing system of claim 1, wherein the undercladding is epitaxial.

5. The chemical sensing system of claim 1, wherein the waveguide is made substantially of barium titanate.

6. The chemical sensing system of claim 5, wherein the waveguide is made substantially of amorphous silicon.

7. The chemical sensing system of claim 1, wherein the undercladding is at least one of ferroelectric, optically nonlinear, or electro-optic.

8. The chemical sensing system of claim 1, further comprising:
   a computational processing module configured to process a signal received from the detector to determine spectral properties of the light exiting the waveguide at the second end and measured at the detector and, based thereon, detect one or more analytes in the chemical sample.

9. The chemical sensing system of claim 1, further comprising means for bringing at least a portion of the waveguide in contact with the chemical sample.

10. The chemical sensing system of claim 9, wherein the means for bringing at least a portion of the waveguide in contact with the chemical sample comprise a microfluidic chamber enclosing the at least a portion of the waveguide.

11. The chemical sensing system of claim 1, wherein at least one of the light source or the detector is monolithically integrated with the photonic chemical sensor on a single substrate.

12. A chemical sensing method comprising:
   applying a chemical sample to a waveguide sensor formed on an undercladding, the undercladding being made substantially of barium titanate or of aluminum nitride, the waveguide and undercladding both being transparent to light over an operating wavelength range, the operating wavelength range comprising a range from about 2.5 μm to about 5 μm;
   coupling light into the waveguide sensor at a first end thereof and measuring light exiting the waveguide sensor at a second end thereof; and
   detecting one or more analytes comprised in the chemical sample based on detection, in the measured light, of one or more characteristic absorptions at one or more respective wavelengths within the operating wavelength range.

13. The method of claim 12, wherein a wavelength of the light coupled into the waveguide sensor is tuned across at least a portion of the operating wavelength range, and wherein the one or more characteristic absorptions each correspond to a decrease in intensity of the measured light at the respective wavelength.

14. The method of claim 12, further comprising:
monitoring a concentration of one of the one or more analytes based on an intensity of light measured at the respective wavelength of the respective characteristic absorption.

15. The method of claim 12, wherein measuring the light exiting the waveguide sensor comprises measuring an optical mode profile of the light and determining an associated mode intensity.

16. The method of claim 12, wherein the one or more analytes comprise a biochemical substance.

17. A method of manufacturing a mid-infrared-transparent waveguide structure, the method comprising:
epitaxially growing a barium titanate film on a substrate;
growing a device layer on top of the barium titanate film; and
forming a waveguide in the device layer by a complementary metal-oxide-semiconductor (CMOS) process.

18. The method of claim 17, wherein the device layer substantially consists of amorphous silicon.

19. The method of claim 17, wherein the substrate substantially consists of lanthanum aluminate.

20. The method of claim 17, wherein forming the waveguide comprises creating a mask on the device layer and transferring the mask to the device layer by reactive ion etching with sulfur hexafluoride.

* * * * *